United States Patent [19]
Krause

[11] Patent Number: 5,440,497
[45] Date of Patent: Aug. 8, 1995

[54] METHOD OF AND SYSTEM FOR LAYING OUT BUS CELLS ON AN INTEGRATED CIRCUIT CHIP

[75] Inventor: David A. Krause, Raleigh, N.C.

[73] Assignee: Mitsubishi Semiconductor America, Inc., Durham, N.C.

[21] Appl. No.: 82,869

[22] Filed: Jun. 29, 1993

[51] Int. Cl.6 ............................................. G06F 17/50
[52] U.S. Cl. .................................... 364/491; 364/488; 364/489; 364/490
[58] Field of Search ................... 364/488–491

[56] References Cited

U.S. PATENT DOCUMENTS

| | | | |
|---|---|---|---|
| 4,593,362 | 6/1986 | Bergeron et al. | 364/488 |
| 4,811,237 | 3/1989 | Putatunda et al. | 364/491 |
| 4,823,276 | 4/1989 | Hiwatashi | 364/491 |
| 4,903,214 | 2/1990 | Hiwatashi | 364/491 |
| 5,065,355 | 11/1991 | Hayase | 395/800 |
| 5,187,671 | 2/1993 | Cobb | 364/490 |
| 5,210,701 | 5/1993 | Hana et al. | 364/491 |
| 5,212,653 | 5/1993 | Tanaka | 364/491 |
| 5,295,082 | 3/1994 | Chang et al. | 364/490 |

*Primary Examiner*—Kevin J. Teska
*Assistant Examiner*—Leigh Marie Garbowski
*Attorney, Agent, or Firm*—Lowe, Price, LeBlanc & Becker

[57] ABSTRACT

In an automatic layout system each signal path is represented in a binary form by its connection points with top, right, bottom and left bus cells on an integrated circuit. A bit-by-bit comparator uses preset table data in a read-only memory to investigate each possible combination of the signal paths in order to select the signal paths that can share a common bus channel. A coordinate comparator uses another preset table data to check whether the selected signal path combination satisfy further conditions of channel sharing. If so, the signal path combination is treated as a single new signal path, which is again investigated to find further possible channel sharing. In a final list of signal paths supplied to a bus cell layout circuit, all of the signal paths that can share a common bus channel are represented as one signal path.

11 Claims, 7 Drawing Sheets

| TABLE A | Decimal Representation of 2nd Signal | | | | | | | | | | | | |
|---|---|---|---|---|---|---|---|---|---|---|---|---|---|
| | | 1 | 2 | 3 | 4 | 6 | 7 | 8 | 9 | 11 | 12 | 13 | 14 | 15 |
| 1 | 0001 | L | - | L | - | - | L | - | L | - | - | L | - | L* |
| 2 | 0010 | - | B | B | - | B | - | - | - | B | - | - | B | B* |
| 3 | 0011 | L | B | - | - | B | - | - | L | - | - | L | B | B/L† |
| 4 | 0100 | - | - | - | R | R | R | - | - | - | R | R | - | R* |
| 6 | 0110 | - | B | B | R | - | - | - | - | B | R | R | - | R/B† |
| 7 | 0111 | L | - | - | R | - | - | - | L | - | R | R/L | - | - |
| 8 | 1000 | - | - | - | - | - | - | T | T | T | T | - | T | T* |
| 9 | 1001 | L | - | L | - | - | L | T | - | - | T | - | T | T/L† |
| 11 | 1011 | - | B | - | - | B | - | T | - | - | T | - | T/B | - |
| 12 | 1100 | - | - | - | R | R | R | T | T | T | - | - | - | T/R† |
| 13 | 1101 | L | - | L | R | R | R/L | - | - | - | - | - | - | - |
| 14 | 1110 | - | B | B | - | - | - | T | T | T/B | - | - | - | - |
| 15 | 1111 | L* | B* | B/L | R* | R/B | - | T* | T/L | - | T/R | - | - | - |

\* Use '15' column on Table B    † Do not use '15' column on Table B

FIG. 4

| TABLE B | | Decimal Representation | | | | | | | | | | | |
|---|---|---|---|---|---|---|---|---|---|---|---|---|---|
| | | 1 | 2 | 3 | 4 | 6 | 7 | 8 | 9 | 11 | 12 | 13 | 14 | 15 |
| L | left | f | - | d | - | - | d | - | b | - | - | b | - | h |
| B | bottom | - | c | c | - | a | - | - | - | c | - | - | a | g |
| R | right | - | - | - | f | d | d | - | - | - | b | b | - | h |
| T | top | - | - | - | - | - | - | e | c | c | a | - | a | g | a: Lowest x-coord must be greater than highest x-coord of other signal.

b: Lowest y-coord must be greater than highest y-coord of other signal.

c: Highest x-coord must be less than lowest x-coord of other signal.

d: Highest y-coord must be less than lowest y-coord of other signal.

e: Lowest and highest x-coords must in combination be either greater than highest x-coord or lower than lowest x-coord of other signal.

f: Lowest and highest y-coords must in combination be either greater than highest y-coord or lower than lowest y-coord of other signal.

g: '15' signal must have two connection points, one less than the lowest x-coord of other signal and one greater than the highest x-coord of other signal.

h: '15' signal must have two connection points, one less than the lowest y-coord of other signal and one greater than the highest y-coord of other signal.

|  | TOP | RIGHT | BOTTOM | LEFT |
|---|---|---|---|---|
| SigA | 2200,4011 | 4580,4011<br>5244,2124 | 2000,1231<br>4034,1624 | 1200,2011 |
| SigB | 3634,4024 |  | 2156,1010 | 1144,3024 |
| SigC | 2056,4120 |  |  | 1536,2120 |
| SigD | 1098,4003 |  | 4603,1098 |  |
| SigE | 1877,4378 | 5332,1212<br>4771,4147 | 4532,1312<br>1209,1048 | 1477,4778<br>1332,3112<br>1249,2298 |
| SigF |  |  |  | 1128,2056 |
| SigG | 5009,4398 | 5078,1236 |  |  |
| ⋮ | ⋮ | ⋮ | ⋮ | ⋮ |

FIG. 7

|  | Bin / Dec | TOP | RIGHT | BOTTOM | LEFT |
|---|---|---|---|---|---|
| SigA | 1111/15 | 2200,4011 | 4580,4011<br>5244,2124 | 2000,1231<br>4034,1624 | 1200,2011 |
| SigB | 1011/11 | 3634,4024 |  | 2156,1010 | 1144,3024 |
| SigC | 1001/9 | 2056,4120 |  |  | 1536,2120 |
| SigD | 1110/14 | 1098,4003 |  | 4603,1098 |  |
| SigE | 1111/15 | 1877,4378 | 5332,1212<br>4771,4147 | 4532,1312<br>1209,1048 | 1477,4778<br>1332,3112<br>1249,2298 |
| SigF | 0001/1 |  |  |  | 1128,2056 |
| SigG | 1100/12 | 5009,4398 | 5078,1236 |  |  |
| ⋮ | ⋮ | ⋮ | ⋮ | ⋮ | ⋮ |

|  | Bin / Dec | TOP | RIGHT | BOTTOM | LEFT |
|---|---|---|---|---|---|
| SigA +SigC | 1111/15 | 2200,4011 2056,4120 | 4580,4011 5244,2124 | 2000,1231 4034,1624 | 1200,2011 1536,2120 |
| SigB | 1011/11 | 3634,4024 |  | 2156,1010 | 1144,3024 |
| SigD | 1110/14 | 1098,4003 |  | 4603,1098 |  |
| SigE | 1111/15 | 1877,4378 | 5332,1212 4771,4147 | 4532,1312 1209,1048 | 1477,4778 1332,3112 1249,2298 |
| SigF | 0001/1 |  |  |  | 1128,2056 |
| SigG | 1100/12 | 5009,4398 | 5078,1236 |  |  |
| ⋮ | ⋮ | ⋮ | ⋮ | ⋮ | ⋮ |

FIG. 10

METHOD OF AND SYSTEM FOR LAYING OUT BUS CELLS ON AN INTEGRATED CIRCUIT CHIP

TECHNICAL FIELD

The present invention relates generally to laying out an integrated circuit chip, and more particularly, to method of and system for laying out bus cells on an integrated circuit chip so as to reduce the chip area occupied by the bus cells.

BACKGROUND ART

One of the most important steps in the design of integrated circuit chips is the layout or routine of conductor paths to be placed on a chip. Modern integrated circuit technology involves thousands of conductor paths that must be routed from one connection point to another to interconnect various logic units. The conductor paths are provided as bus cells placed in various locations on a chip and occupying a significant portion of a chip.

The size of a chip is an important factor in the ultimate cost of the integrated circuit. The more the chip size is reduced, the more chips that can be produced per wafer. The larger the number of integrated circuits which are manufactured per wafer, the smaller are the production costs per chip. Reducing the area occupied by bus cells reduces total chip size and, hence, unit chip cost.

A plurality of parallel bus channels are provided in a bus cell area to carry the signals to be transferred through the bus cell. Each bus channel occupies a strip having sufficient width to carry one signal passing through the bus cell. While to minimize the occupied chip area, the width of each channel and the spaces between the channels should be reduced, at least minimum channel widths and spaces must be maintained to avoid short circuits and parasitic effects despite slight variations in the manufacturing process due to the presence of minute submicron particulates that are invariably present in the semiconductor processing facility.

In view of the above, it would be desirable to minimize the number of bus channels in each bus cell to reduce the chip area occupied by the bus cell.

Further, as the layout of conductor paths is performed by a computerized routine system, it would be desirable to use a systematic and iterative process to reduce the bus cell size.

DISCLOSURE OF THE INVENTION

Accordingly, one advantage of the invention is in minimizing the number of bus channels of a bus cell to reduce the chip area occupied by the bus cell.

Another advantage of the invention is in using a systematic and iterative algorithm for the bus cell reduction process.

The above and other advantages of the invention are achieved, at least in part, by providing a method of and system for laying out signal paths on an integrated circuit chip, which allow a common bus channel to be shared by the maximum number of signal paths. In accordance with one aspect of the invention, the method involves supplying the layout system with coordinates of signal paths to be routed through bus strips on the integrated circuit. The coordinates of each signal path are encoded so as to represent the bus strips connected to the signal path as a first logic level, and to represent the bus strips which are not connected to the signal path as a second logic level. Bit-by-bit comparing allows the signal paths that can share a common bus strip to be selected. Then, the coordinates of the selected signal paths are compared to find the selected signal paths that do not overlap with one another. These signal paths are combined into a common bus channel.

In accordance with another aspect of the invention, the system comprises a binary encoder which encodes the coordinates of each of the signal paths into a bit string representing the buses connected to the signal path. A binary comparator compares the bit strings of the signal paths to select the paths that can pass through a common bus. A coordinate comparator for comparing the coordinates of the selected signal paths chooses the selected conductor paths that do not overlap with each other. A combining circuit combines the chosen signal paths into a common bus channel.

In accordance with a further aspect of the invention, a method of reducing the number of channels in multi-channel buses to be placed on an integrated circuit involves entering coordinates of connection points where signal paths to be routed through the buses enter and leave the buses. The coordinates of first and second signal paths are compared to determine whether they share a common bus. If the first and second signal paths share the common bus, their coordinates are compared to determine whether they overlap one another. If these two signal paths do not overlap with one another, they are combined into a common signal path to be routed through a common channel in the buses.

Still other advantages of the present invention will become readily apparent to those skilled in this art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawing and description are to be regarded as illustrative in nature, and not as restrictive.

BEST MODE FOR CARRYING OUT THE INVENTION

Figure 1:
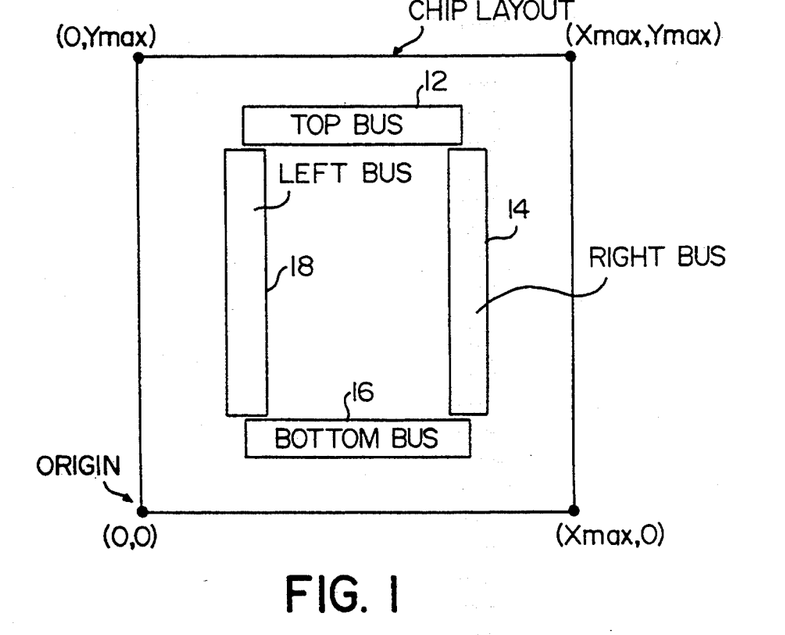
FIG. 1 shows an integrated circuit chip with a coordinate system in accordance with the invention.
Figure 2:
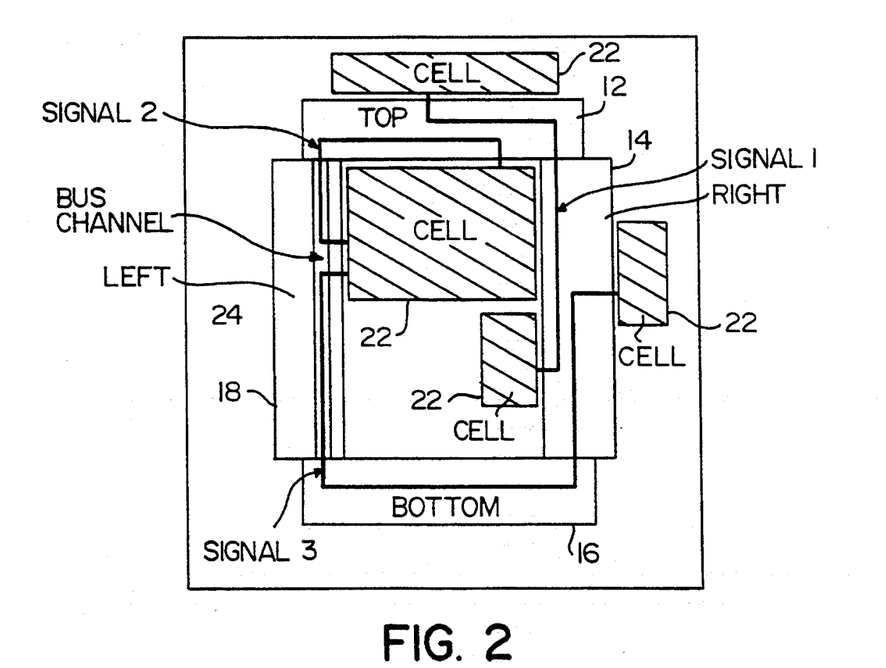
FIG. 2 illustrates an example of bus channel sharing.

The best mode for practicing the invention is based on the realization that the chip layout has the configuration and orientation shown in FIG. 1 of the drawings, wherein an integrated circuit comprises top, right, bottom and left bus cells 12–18 having a plurality of bus channels, which carry various signals to be transferred through the bus cells. FIG. 2 shows exemplary paths of signals 1, 2 and 3 transmitted through the top, right, bottom and left bus cells 12–18 between logic cells 22. As shown, the path of signal 1 cannot share the bus channels with either of the other two signal paths. However, the paths of signals 2 and 3 can be routed through a common bus channel 24 in the left bus 18. This permits the width of the left bus 18 to be reduced by an amount equal to the width of one bus channel. The objective of the present invention is to allow bus channels to be shared by the maximum number of signals.

As shown in FIG. 1, the layout system uses a rectangular cartesian coordinate system to define x, y coordinates of various points within the integrated circuit. The coordinate system has the origin located at the left corner of the integrated circuit. The x-axis of the coordinate system is parallel to the top and bottom buses. The y-axis is parallel to the right and left buses.

Figure 3:
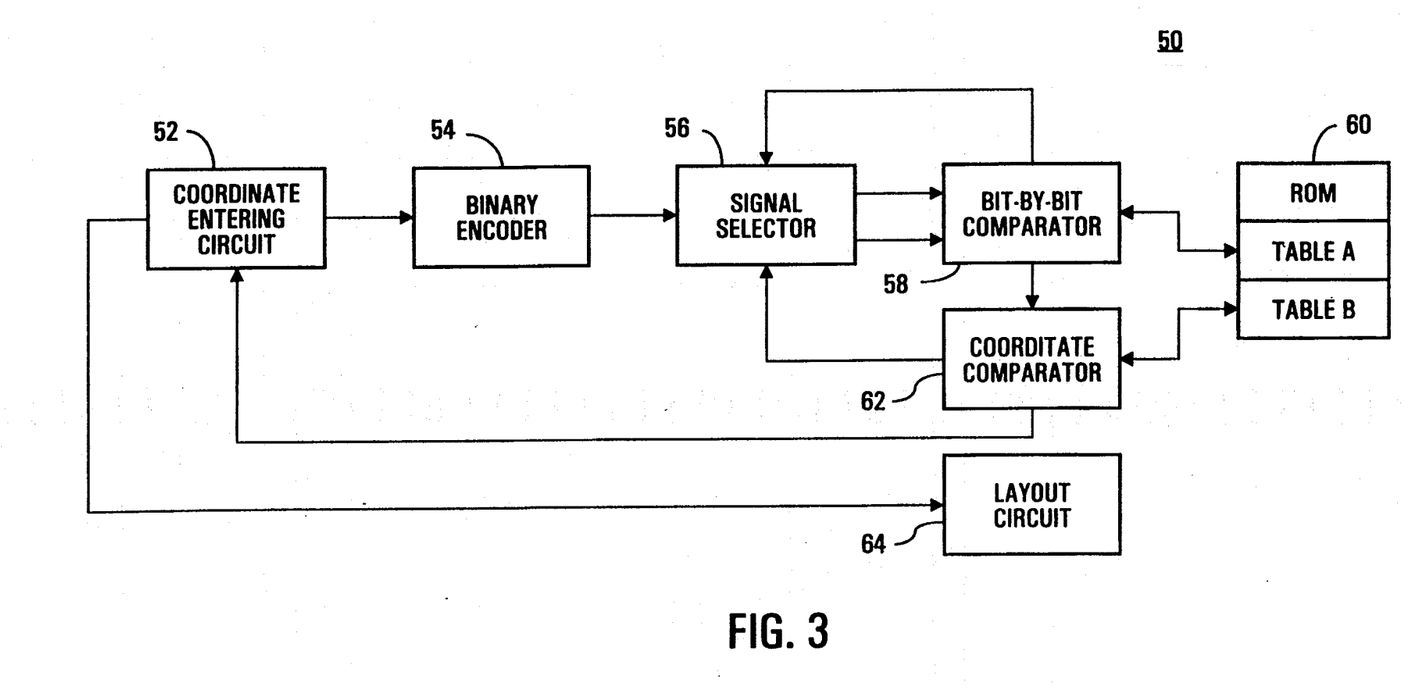
FIG. 3 is a block-diagram of a bus cell layout system in accordance with the invention.

Reference is now made to FIG. 3 of the drawings showing a block-diagram of a bus cell layout system 50, which is designed to detect the channel sharing possibilities. The system comprises a coordinate entering circuit 52, which supplies cartesian coordinates of all signal paths to be routed through the bus cells 12–18. A binary encoder 54 is provided to present the signal paths in a binary form. A signal selector 56 is able to select the signals required for processing. In order to determine whether the signal paths can share a bus channel, a bit-by-bit comparator 58 is provided. The comparator 58 consults a read-only memory (ROM) 60 storing table A, shown in FIG. 4, which contains the information required to make the decision. If channel sharing is possible, a coordinate comparator 62 is used to make sure that the selected signal paths do not overlap with one another. The comparator 62 consults table B shown in FIG. 5, which is stored in the ROM 60 and provides the information required to confirm the channel sharing possibilities. A layout circuit 64 is activated when all of the signal paths are processed to perform the signal path layout on an integrated circuit chip.

Figure 6:
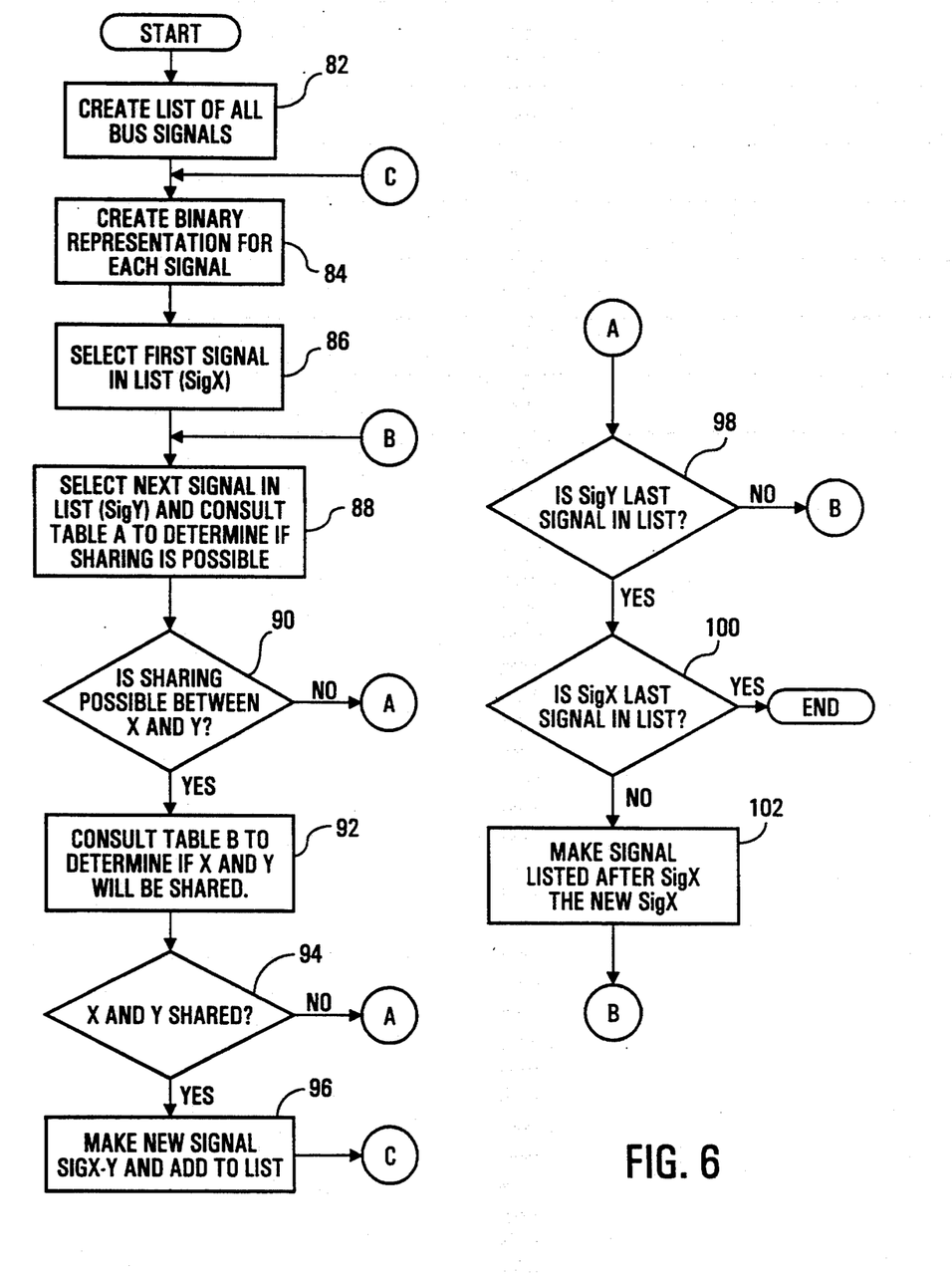
FIG. 6 is a flow-chart for bus cell area reduction process in accordance with the invention.
Figure 7:
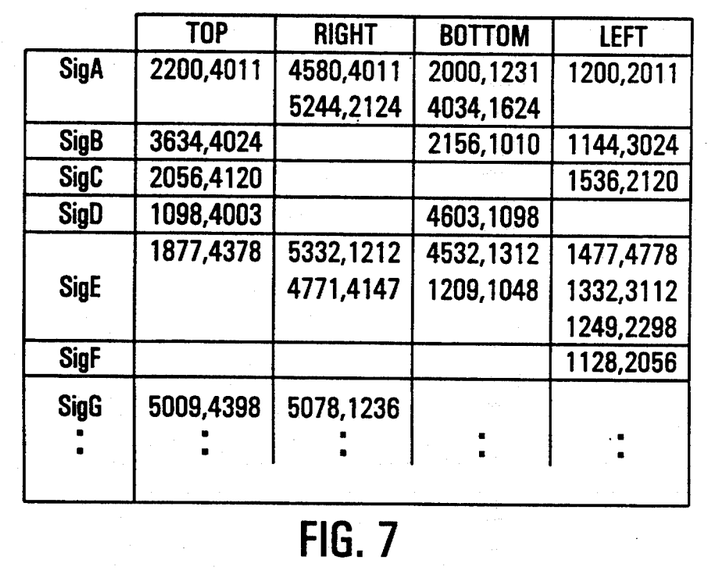
FIG. 7 shows an example of a list of signal paths compiled by the coordinate entering circuit of the system shown in FIG. 3.

Reference is now made to FIG. 6 of the drawings showing a flow-chart of the algorithm performed by the system 50 to minimize the number of the bus channels on an integrated circuit. In the first step of the algorithm (block 82), the coordinate entering circuit 52 enters the coordinates of all of the signal paths to be routed through the bus cells and compiles a list of the signal paths. Each signal path in the list is represented by the x, y coordinates of all connection points where the signal path enters and/or leaves the top, right, bottom and left buses cells 12, 14, 16 and 18, respectively. An example of the list comprising exemplary signal paths A–G is shown in FIG. 7.

Figure 8:
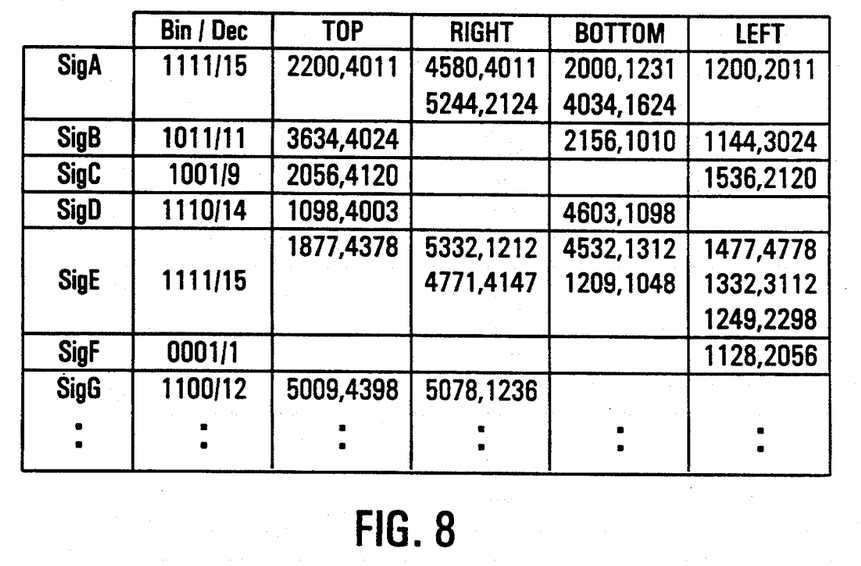
FIG. 8 shows an example of a list of signal paths with their binary representations.

The algorithm then moves to block 84 where the binary encoder 54 creates a binary representation for each signal path in the list. In this binary representation, each bit corresponds to one of the bus cells 12–18. If a signal path has any connection points on the corresponding bus cell, its bit is set to "1". If a signal path has no connection points on the corresponding bus cell, its bit is set to "0". The most significant bit of the binary representation corresponds to the top bus 12, the next most significant bit represents the right bus 14, the next bit corresponds to the bottom bus 16 and the least significant bit represents the left bus 18. For example, a signal path that has connection points on all of the bus cells is represented by "1111", a signal path connected only with the top, right and bottom buses is represented by "1110", a signal path having connection points only with the top and right buses is represented by "1100", etc. The list of the exemplary signal paths A–G with their binary representations is shown in FIG. 8. This list comprises also a decimal value of the binary code corresponding to each signal.

When the binary representation of a signal path is "0101" or "1010" (as with SigD in FIG. 8), it means that the signal passes through a "bridge" bus cell between the bus cells having connection points with the signal path. Although such a signal path has no connection points on the "bridge" bus cell, its binary representation is modified by the binary encoder 54 to account for the "bridge" bus cell. Accordingly, "0101" (5) is changed to "0111" (7) or "1101" (13), and "1010" (10) is changed to "1110" (14) or "1011" (11).

In accordance with the step represented by block 86, the signal selector 56 selects the first signal path (SigX) in the list. In the next step (block 88), the signal selector 56 selects the next signal path (SigY) in the list. The binary representations of these signals paths are transferred to the bit-by-bit comparator 58, which compares the bits of the binary representations and consults Table A (FIG. 4) to determine in step 90 whether bus channel sharing is possible between SigX and SigY or not. Table A is created by examining all two-signal combinations to determine if bus channel sharing is possible and, if so, in which bus cell or cell would the sharing occur. If two signal paths have "1" in the same bit, it means that the bus corresponding to this bit is shared by the signal paths. Accordingly, it may be possible for them to share a common channel in this bus. However, a common channel cannot be shared if the signal paths coexist in two adjacent bus cells.

Figure 4:
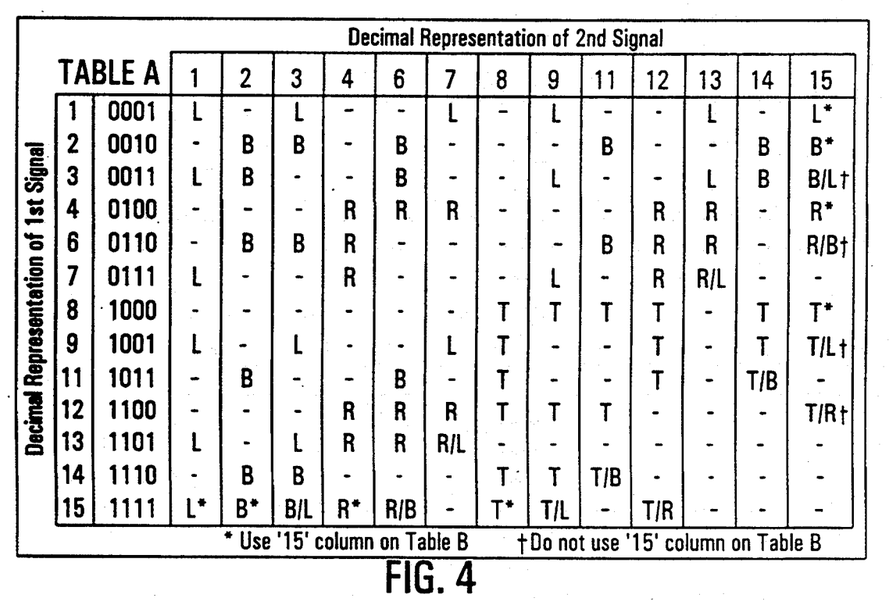
FIG. 4 shows the contents of Table A stored in the ROM of the system shown in FIG. 3.

As shown in FIG. 4, the rows of Table A represent all possible binary combinations of the first signal SigX, and the columns represent the decimal values of all possible binary combination of the second signal SigY. A dash (-) in the intersection indicates that the corresponding signal paths cannot share a bus channel. However, if a letter or pair of letters is found in the intersection, this indicates that the sharing of the two corresponding signal paths by a common bus channel may be possible. Letter "T" in the table stands for the top bus and indicates that a common channel in the top bus cell is possible. Letter "R" in the table stands for the right bus and indicates that a common channel in the right bus cell is possible. Letter "B" in the table stands for the bottom bus and indicates that a common channel in the bottom bus cell is possible. Letter "L" in the table stands for the left bus and indicates that a common channel in the left bus cell is possible. A pair of letters in the intersection shows that the corresponding two signals may be able to share a channel in the bus cells labeled by the letters.

Figure 9:
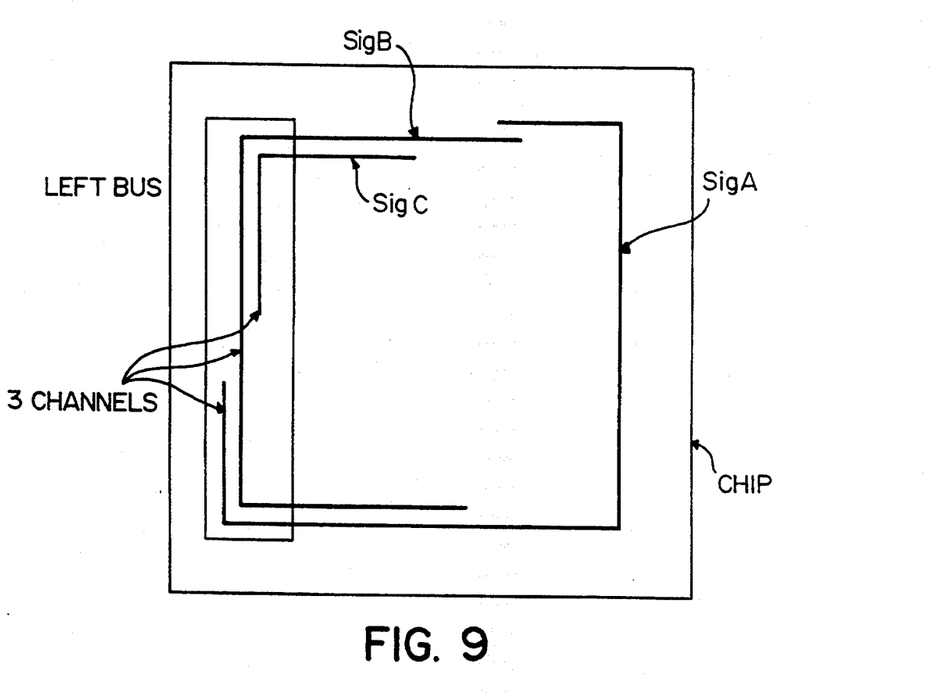
FIG. 9 illustrates signal paths SigA, SigB and SigC of the lists shown in FIGS. 7 and 8.

For example, the signal paths SigA and SigB shown in FIG. 9 cannot share a bus channel since they coexist in the adjacent bus cells. Accordingly, cross-reference to Table A yields "-". However, although both of the signal paths SigA and SigC in FIG. 9 have connection points on the top and left bus cells, they can share a bus channel because they pass through different portions of the bus cells and, therefore, do not coexist in these bus cells. Accordingly, cross-reference to Table A yields "T/L".

Figure 5:
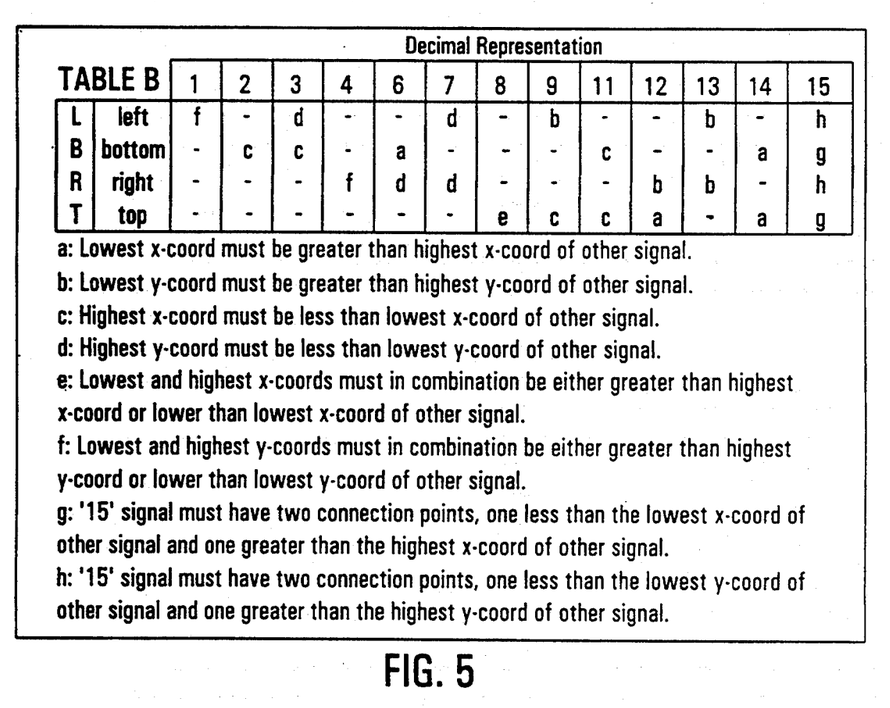
FIG. 5 shows the contents of Table B stored in the ROM of the system shown in FIG. 3.

If Table A indicates in step 90 that the channel sharing is possible between the signal paths SigX and SigY, the bit-by-bit comparator 58 sends these signal paths to a coordinate comparator 62, which processes their coordinates and consults Table B shown in FIG. 5 to determine whether SigX and SigY will be shared by a common channel (block 92). The coordinate comparator 62 compares the maximum and minimum x, y coordinates of signal paths SigX and SigY to check that these signal paths do not overlap with each other. For each of the letters obtained from Table A, Table B specifies further conditions which must be satisfied to confirm the channel sharing possibilities indicated by Table A. Table B is created by looking at every possibility for each of the four bus cells and determining what maximum and/or minimum x and y coordinates are required for two given signals to share a channel. The x and y coordinates of both signals must be such that two signals do nor overlap with one another.

Table B comprises four rows comprising the letters L, B, R and T obtained from Table A, which correspond to the left, bottom, right and top bus cells where the signal paths SigX and SigY can be shared. Columns of Table B contain all possible binary combinations of the signal paths represented by their decimal values from 1 to 15. Intersections between the rows and the columns indicate the conditions that must be satisfied to allow a bus channel to be shared by the given two signal paths. A dash (-) in the intersection shows that no bus channels can be shared. Letter "a" in the intersection requires the lowest x coordinate of one of the signal paths to be greater than the highest x coordinate of another. Letter "b" requires the lowest y coordinate of one signal path to be greater than the highest y coordinate of another. Letter "c" indicates that the highest x coordinate of one signal path must be less than the lowest x coordinate of another. Letter "d" requires the highest y coordinate of one signal path to be less than the lowest y coordinate of another. Letter "e" indicates that the lowest and highest x coordinates of one signal path must in combination be either greater than the highest x coordinate or lower than lowest x coordinate of another. Letter "f" indicates that the lowest and highest y coordinates of one signal path must in combination be either greater than the highest y coordinate or lower than lowest y coordinate of another. Letter "g" requires a signal path represented by decimal value "15" to have two connection points, one less than the lowest x coordinate of another signal path and one greater than the highest x coordinate of another signal path. Letter "h" requires a signal path represented by decimal value "15" to have two connection points, one less than the lowest y coordinate of another signal path and one greater than the highest y coordinate of another signal path.

To determine the condition that must be satisfied for the signal paths SigX and SigY to confirm that they can share a common bus channel, the system finds the intersection between the letters L, B, R or T obtained from Table A and the decimal representation of one of the two signal paths. If a pair of the letters is obtained from Table A, the conditions applied to each of the letters must both be satisfied in order for the two signal paths to share a bus channel. If one of the signal paths is represented by "15", the "15" column of Table B must be used. However, if a pair of letters is obtained from Table A, the "15" column of Table B is not used.

The coordinate comparator 62 processes the x and y coordinates of the signal paths SigX and SigY to check whether the conditions of Table B are satisfied or not (block 94). If the conditions are satisfied, the signal paths SigX and SigY can share a bus channel. Accordingly, they are treated as one signal path SIGX-Y (block 96). The algorithm then transfers to block 84 in order to send this newly created signal path along with x, y coordinates of its connection points to the binary encoder 54, which creates binary representation of the new signal path SigX-Y and updates the list of the signal paths. The system repeats steps 84–96 to determine whether the new signal path can share bus channels with other signal paths in the list. However, if the newly created signal path has a decimal representation of "15" it cannot be used in any further bus channel sharing. The steps 84–96 are repeated until all possible signal path combination have been investigated and no further channel sharing is possible.

Figure 10:
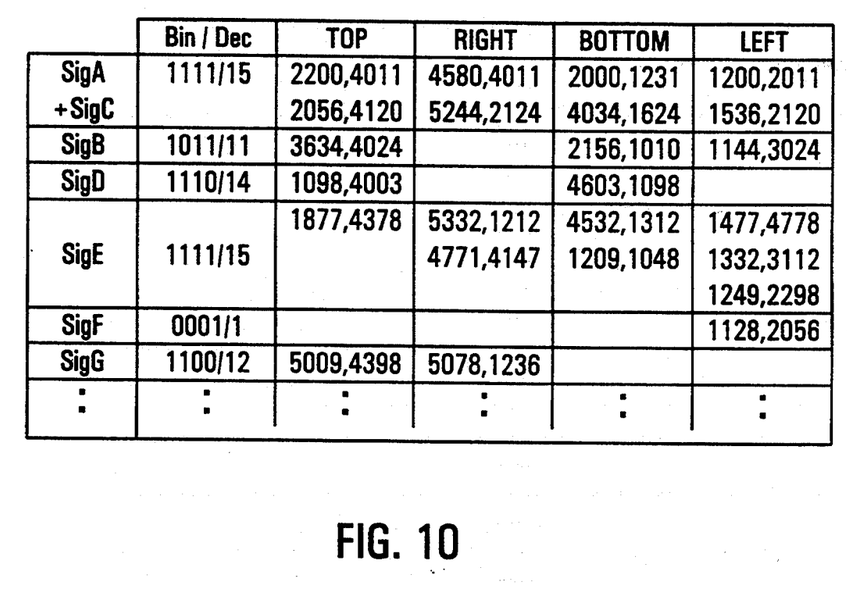
FIG. 10 shows an example of a revised list of signal paths.
Figure 11:
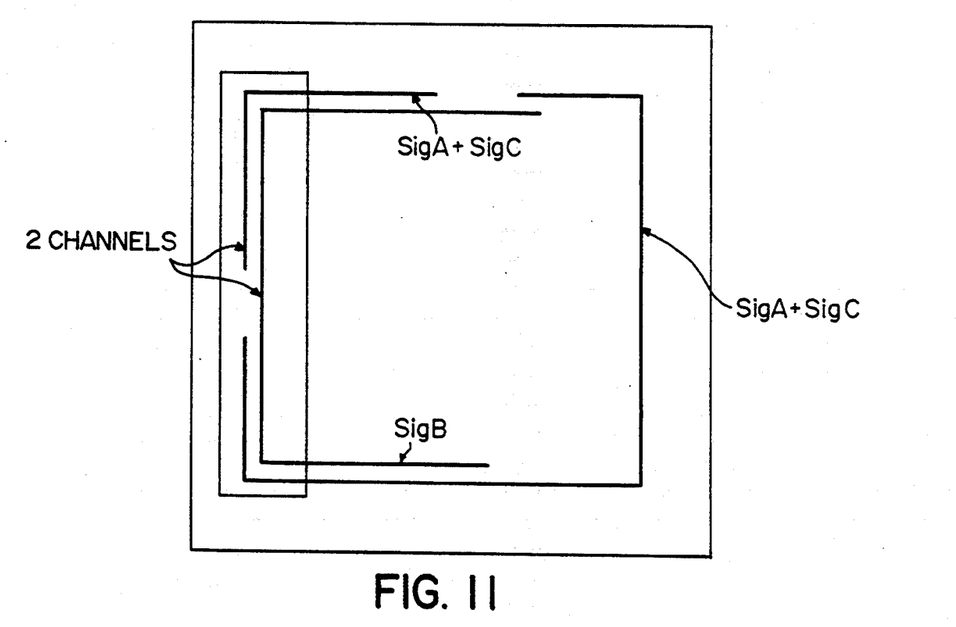
FIGS. 11 illustrates a method of reducing the number of bus channels in accordance with the present invention.

For example, as indicated above, in the case of SigA and SigB shown in FIG. 9, Table A yields "T/L". As SigA is represented by "15" and a pair of letters is obtained from Table A, Table B is checked for conditions that must be satisfied for the SigC having decimal representation of "9". Cross-referencing "9" with "T" on Table B results in a "c". Since SigC's x coordinate in the top (T) bus cell (2056) is less than SigA's (2200), this condition is satisfied. Cross-referencing "9" with "L" yields a "b". Since SigC's y coordinate on the left (L) bus cell (2120) is less than SigA's (2011), this condition is also satisfied. Accordingly, a new signal SigA+SigC is created. An example of a revised list of signal paths, wherein the SigA and SigB paths are replaced with a single SigA+SigB path, is shown in FIG. 10. As illustrated in FIG. 11, while the SigA and SigC paths occupied separate bus channels, the SigA+SigC path shares a common bus channel. Accordingly, the sizes of both the top and left bus cells are reduced by one channel width. However, since the SigA+SigC path has a decimal representation of "15" it cannot share a bus channel with any other signal paths.

If the bit-by-bit comparator in step 90 or the coordinate comparator 62 in step 94 indicates that no sharing between the SigX and SigY paths is possible, the system transfers to block 98 in order to determine if the SigY path is the last signal path in the list. If no, the system transfers to block 88, where the signal selector 56 selects the next signal path in the list. This signal path is made into a new SigY path to be compared in steps 90–94 with the SigX path.

If the SigY is the last signal path in the list, the system moves to block 100 in order to determine if the SigX path is the last signal path in the list. If no, the system makes the signal path listed after the SigX path the new SigX path (block 102) and transfers to block 88, where the next SigY path is selected for further processing.

If the SigX path is the last signal path in the list, the algorithm ends, indicating that all possible signal combination have been investigated and no further sharing is possible. As a result, in the list of signal paths all of the signal paths that can share a common bus channel are replaced with one signal path occupying this bus channel. Accordingly, the number of bus channel required to carry the signal paths in the list are significantly reduced. The final list of signal paths is supplied to the layout circuit 64 for routing the signal paths on the integrated circuit chip in a conventional manner.

There accordingly has been described a system and method for laying out signal paths on an integrated circuit by finding the maximum number of signal paths that can share bus channels. Signal paths to be routed are represented in a binary form by their connection points with bus cells of the integrated circuit. All possible combinations of signal paths are investigated by a bit-by-bit comparator using preset table data in a read-only memory to select the signal paths that can share a common bus channel. A coordinate comparator uses another preset table data to check whether the selected signal paths satisfy further conditions of channel sharing. A final list of signal paths supplied to a layout circuit combines all signal paths that can share a common bus channel into one signal path.

Accordingly, a number of channels in a bus cell is decreased. This results in reducing the chip area occupied by bus cells.

In this disclosure, there are shown and described only the preferred embodiments of the invention, but it is to be understood that the invention is capable of changes and modifications within the scope of the inventive concept as expressed herein.

What is claimed is:

1. A method of laying out signal paths on an integrated circuit having first, second, third and fourth bus strips using an automatic layout system having a binary encoder, a bit-by-bit comparator and a coordinate comparator, said first bus strip being parallel to said third bus strip and perpendicular to said second and fourth bus strips, said method comprising the steps of:
    supplying the automatic layout system with coordinates of signal paths to be routed through said first, second, third and fourth bus strips;
    forming by the binary encoder a binary representation of each of the signal paths so as to define any of the first, second, third and fourth bits of the binary representation as a first logic level if the corresponding signal path passes through said first, second, third and fourth bus strips, respectively, and to define any of the first, second, third and fourth bits of the binary representation as a second logic level if the corresponding signal path does not pass through said first, second, third and fourth bus strips, respectively;
    comparing by the bit-by-bit comparator the binary representation of each of the signal paths to select the signal paths that share one of the bus strips;
    comparing by the coordinate comparator the coordinates of each of the selected signal paths to find the signal paths that do not overlap with one another; and
    laying out the signal paths that do not overlap with one another as a common signal path.

2. The method of claim 1, wherein said step of comparing the binary representation comprises determining whether the first, second, third and fourth bits of one of the signal paths respectively coincide with the first, second, third and fourth bits of another of the signal paths.

3. The method of claim 1, wherein said step of comparing the binary representation comprises determining whether the signal paths pass through bus strips adjacent with one another.

4. The method of claim 1, wherein said step of comparing the coordinates comprises determining maximum and minimum coordinates of the signal paths that share one of the bus strips.

5. The method of claim 4, wherein said step of comparing the coordinates further comprises comparing the maximum coordinate of one signal path with the minimum coordinate of another signal path to determine whether the signal paths overlap with one another.

6. The method of claim 1, wherein the coordinates of the signal paths are defined in a cartesian coordinate system having the origin at a corner of the integrated circuit, the first axis parallel to said first and third bus strips and the second axis parallel to said second and fourth bus strips.

7. A system for laying out signal paths on an integrated circuit having a plurality of logic cells and first, second, third and fourth multichannel buses providing connections between the logic cells, said first bus being parallel to said third bus and perpendicular to said second and fourth buses, said system comprising:
    coordinate entering means for entering the coordinates of the signal paths to be routed through said first, second, third and fourth buses;
    binary encoding means responsive to said coordinate entering means for forming a binary representation of each of the signal paths so as to define any of the first, second, third and fourth bits of the binary representation as a first logic level if the corresponding signal path passes through said first, second, third and fourth buses, respectively, and to define any of the first, second, third and fourth bits of the binary representation as a second logic level if the corresponding signal path does not pass through said first, second, third and fourth buses, respectively;
    bit-by-bit comparing means responsive to said binary encoding means for comparing the corresponding bits in the binary representation of each of the signal paths to select the signal paths that share one bus;
    coordinate comparing means responsive to said bit-by-bit comparing means and coordinate entering means for comparing the coordinates of each of the selected signal paths that share one bus to select the signal paths that do not overlap with one another;
    combining means responsive to said coordinate comparing means for combining the selected signal paths that do not overlap with one another in a common bus channel; and
    laying out means responsive to said combining means for laying out the combined selected signal paths.

8. The system of claim 7, wherein the coordinates of the signal paths are defined in a cartesian coordinate system having the origin at a corner of the integrated circuit, the first axis parallel to said first and third buses and the second axis parallel to said second and fourth buses.

9. A method of reducing the number of channels in multichannel buses to be placed on an integrated circuit, comprising the steps of:
    entering coordinates of connection points where signal paths to be routed through said buses enter and leave said buses to represent said signal paths,
    comparing first and second signal paths to be routed through first and second channels of the buses, respectively, to determine whether they share a common bus, if the first and second signal paths share the common bus, determining whether they overlap with one another, combining the first and the second signal paths into a common signal path to be routed through a single common channel, if they do not overlap with one another, and laying out the common signal path through the single common channel.

10. The method of claim 9, further comprising the steps of:

comparing the combined signal path with a third signal path to be routed through a third channel of said buses, to determine whether the combined signal path shares a common bus with the third signal path, if the combined and the third signal paths share the common bus, determining whether they overlap with one another, and combining the combined signal path and the third signal path into a composite signal path to be routed through a single composite channel of said buses, if they do not overlap with one another.

11. A system for laying out conductor paths on an integrated circuit using coordinates of the conductor paths with respect to reference buses on said integrated circuit, comprising:

a binary encoder for encoding the coordinates of each of the conductor paths into a bit string representing the reference buses connected to the conductor paths, a binary comparator for comparing the bit strings of the conductor paths to select the conductor paths that pass through common reference buses, a coordinate comparator for comparing the coordinates of the selected conductor paths to choose the selected conductor paths that do not overlap with each other, a combining circuit for combining the chosen conductor paths into a common path in the reference buses, and a laying out circuit for laying out the common path on the integrated circuit.

* * * * *